US006661689B2

United States Patent
Asao et al.

(10) Patent No.: US 6,661,689 B2
(45) Date of Patent: Dec. 9, 2003

(54) SEMICONDUCTOR MEMORY DEVICE

(75) Inventors: Yoshiaki Asao, Yokohama (JP); Hiroshi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 27 days.

(21) Appl. No.: 10/025,753

(22) Filed: Dec. 26, 2001

(65) Prior Publication Data

US 2002/0080641 A1 Jun. 27, 2002

(30) Foreign Application Priority Data

Dec. 27, 2000 (JP) ........................................ 2000-399223
Dec. 6, 2001 (JP) ........................................ 2001-373071

(51) Int. Cl.[7] .................................................. G11C 5/06
(52) U.S. Cl. ........................... 365/63; 365/72; 365/158; 365/171
(58) Field of Search ............................ 365/63, 72, 158, 365/171, 173; 257/421, 200; 327/482, 112

(56) References Cited

U.S. PATENT DOCUMENTS 6,522,575 B2 * 2/2003 Inui ............................ 365/158

| 2001/0035545 | A1 | 11/2001 | Schuster-Woldan et al. |
| 2002/0135018 | A1 * | 9/2002 | Hidaka ........................ 257/359 |
| 2003/0002333 | A1 * | 1/2003 | Hidaka ........................ 365/171 |

FOREIGN PATENT DOCUMENTS

| JP | 11-110961 | 4/1999 |
| JP | 2000-315383 | 11/2000 |
| JP | 2001-217398 | 8/2001 |
| JP | 2001-357666 | 12/2001 |

* cited by examiner

Primary Examiner—Richard Elms
Assistant Examiner—Nam Nguyen
(74) Attorney, Agent, or Firm—Oblon, Spivak, McClelland, Maier & Neustadt, P.C.

(57) ABSTRACT

A semiconductor memory device includes a plurality of first wirings extending in a first direction, a plurality of memory elements connected with the first wirings, a plurality of second wirings extending in a second direction different from the first direction, the second wirings being disposed opposite to the first wirings with the memory elements interposed between the first and second wirings, the second wirings being spaced from the memory elements, and first transistors or diodes connected between two adjacent of the second wirings.

18 Claims, 18 Drawing Sheets

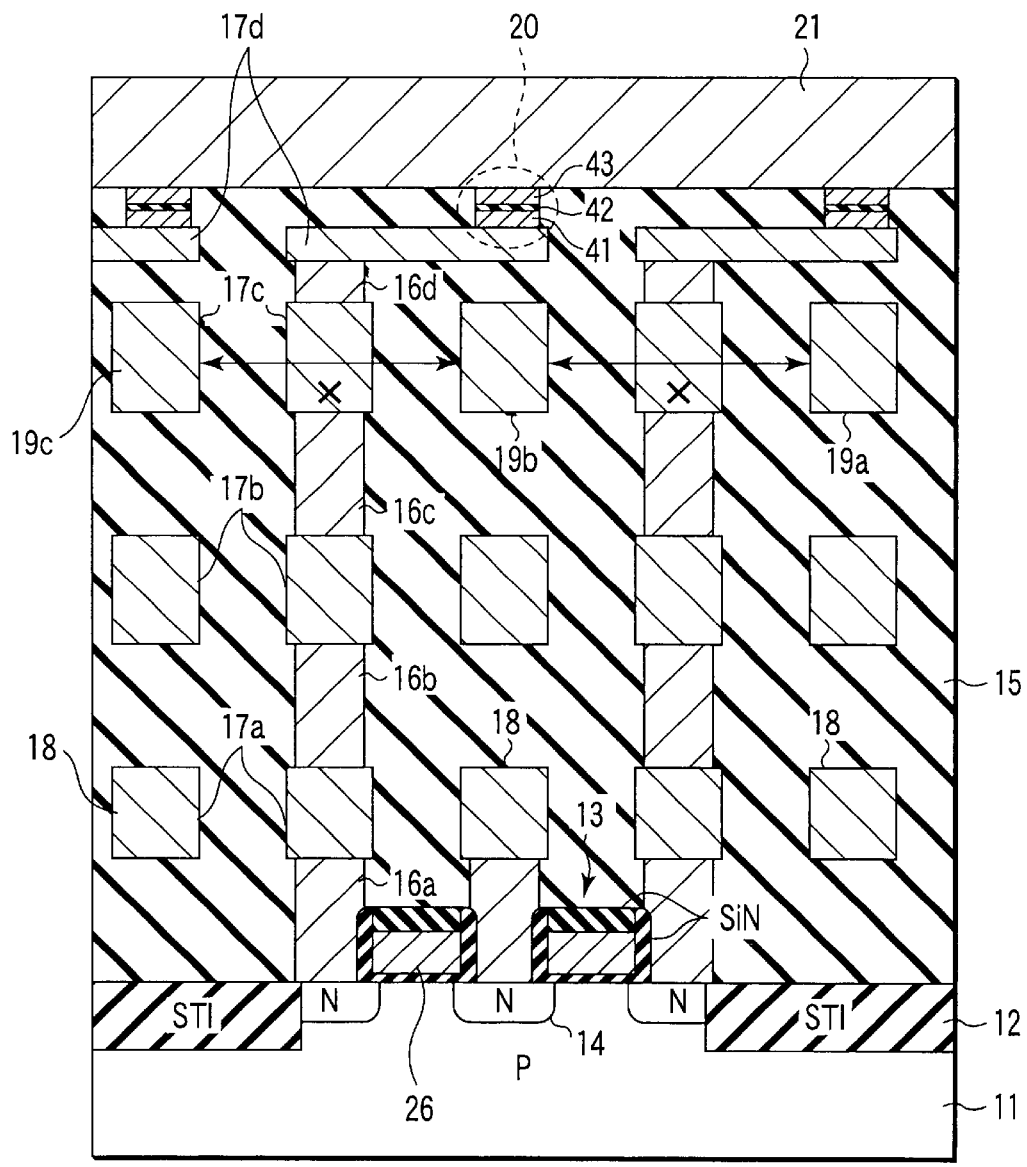
F I G. 2

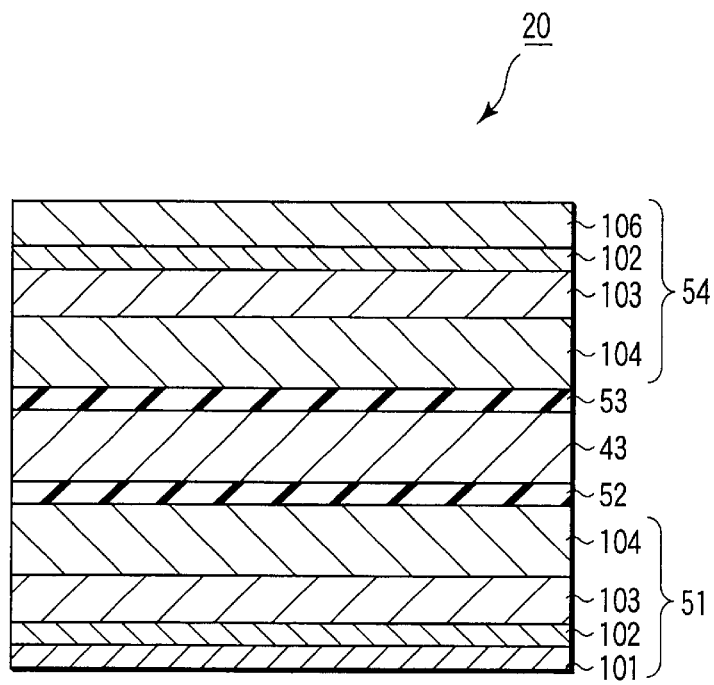
F I G. 5A
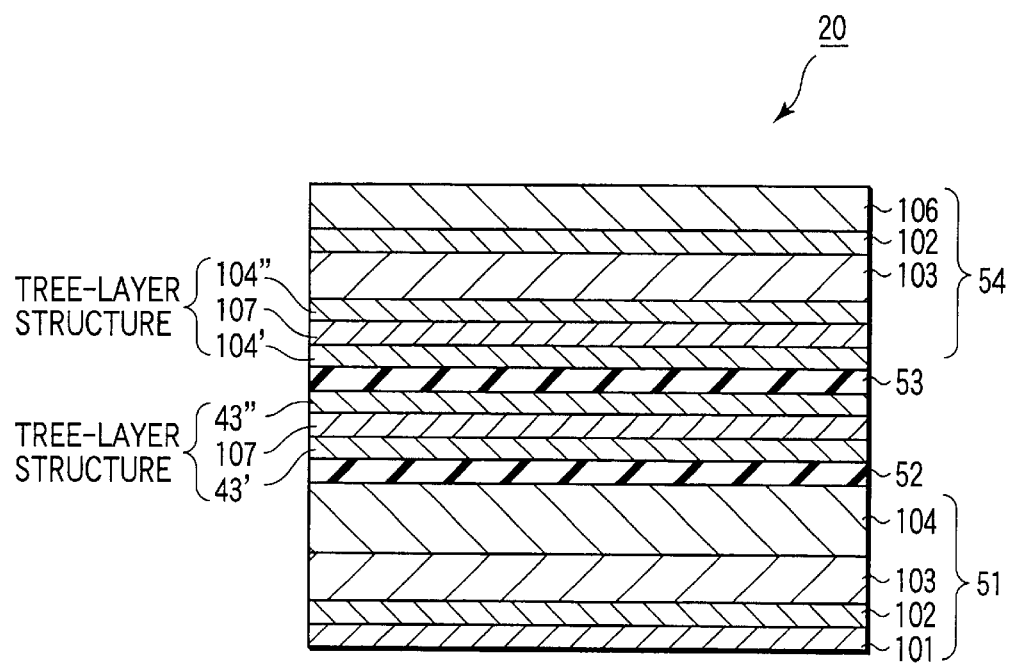
F I G. 5B

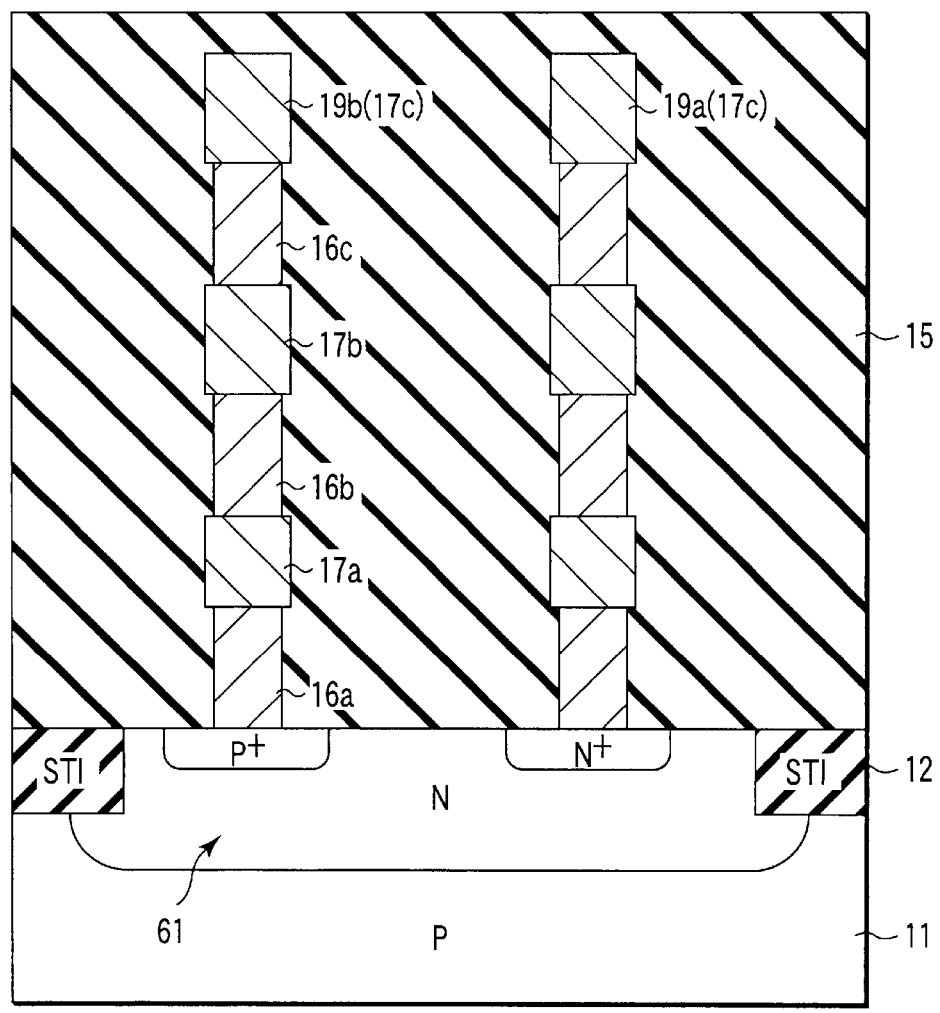
F I G. 10

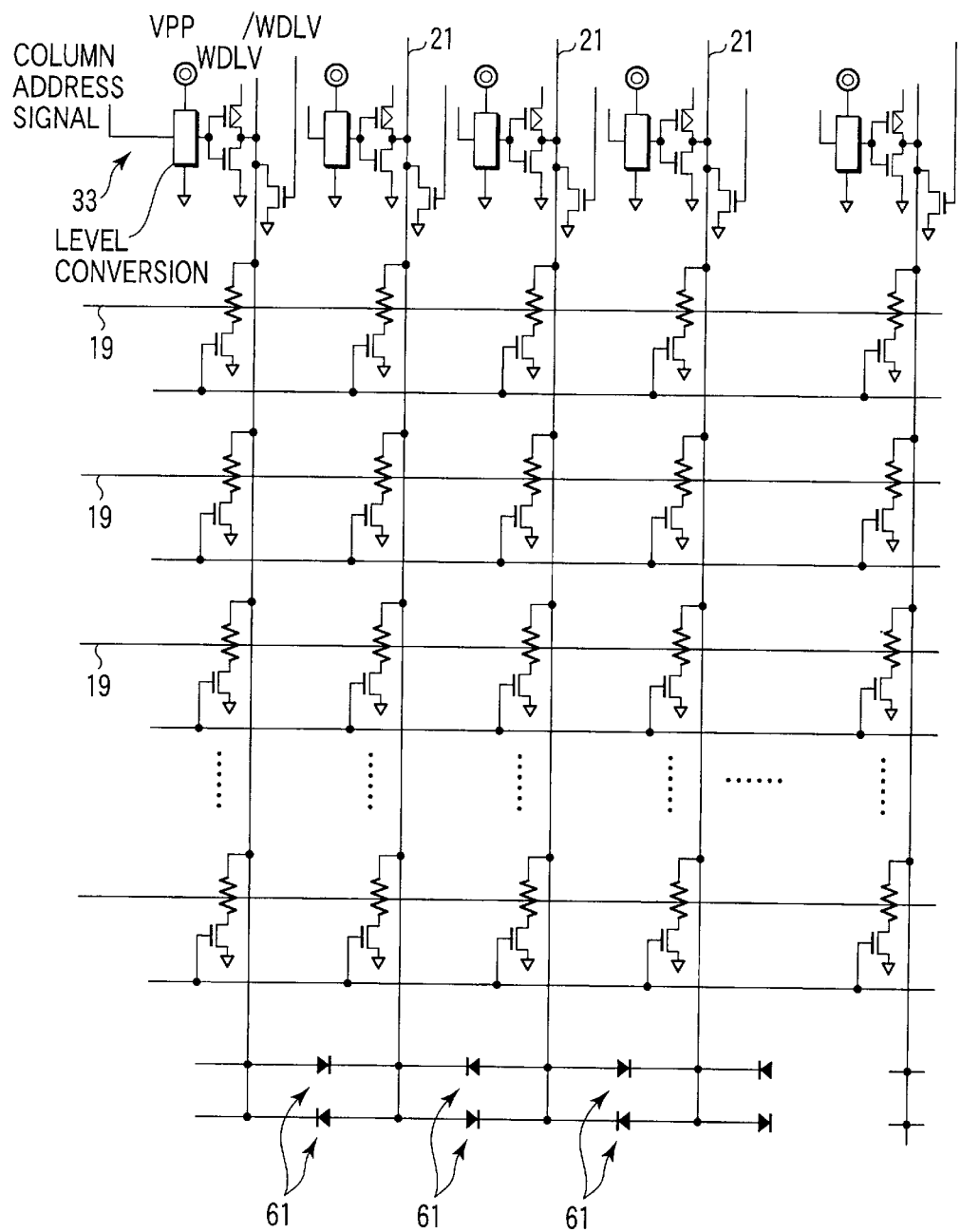
F I G. 11

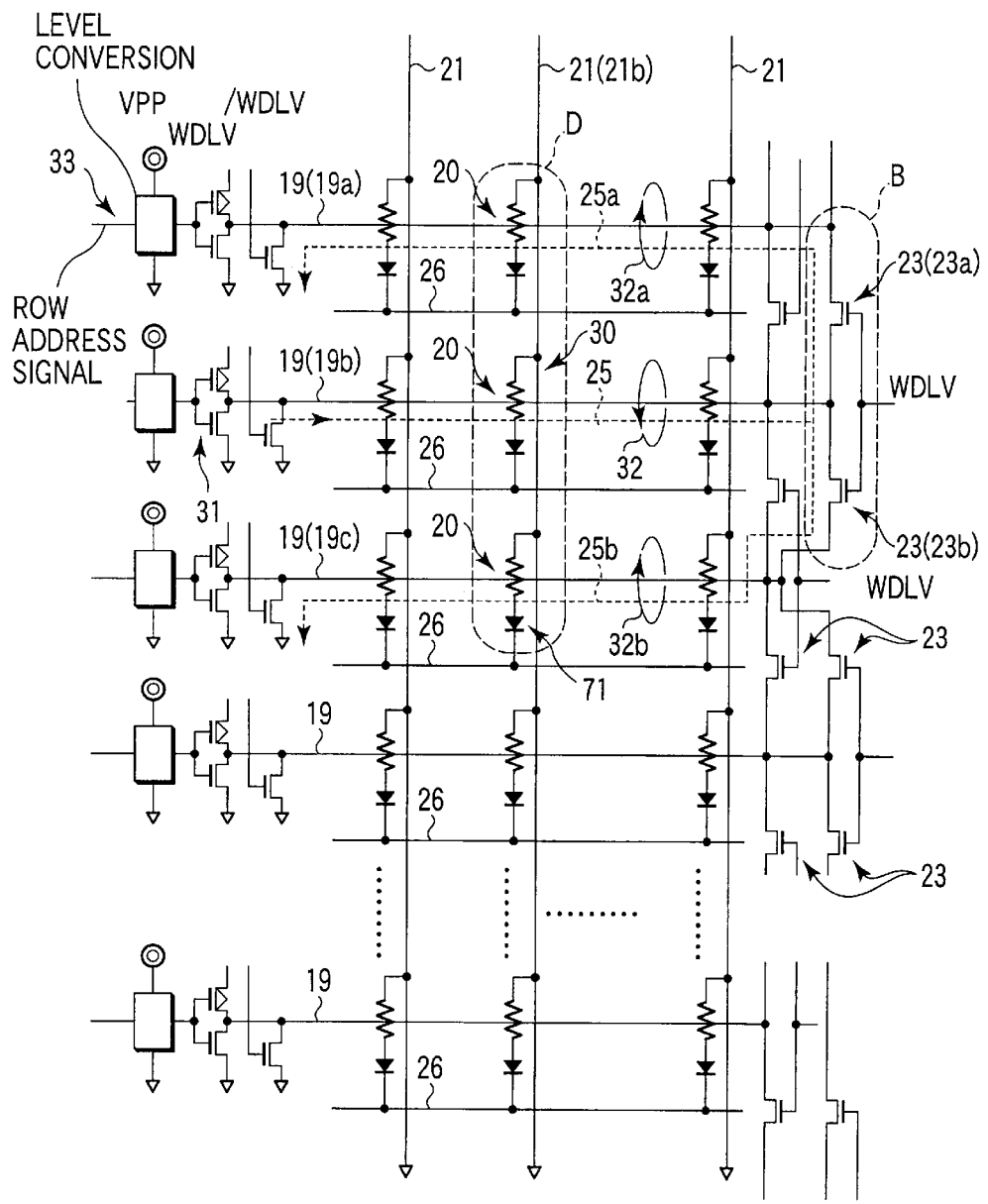
F I G. 12

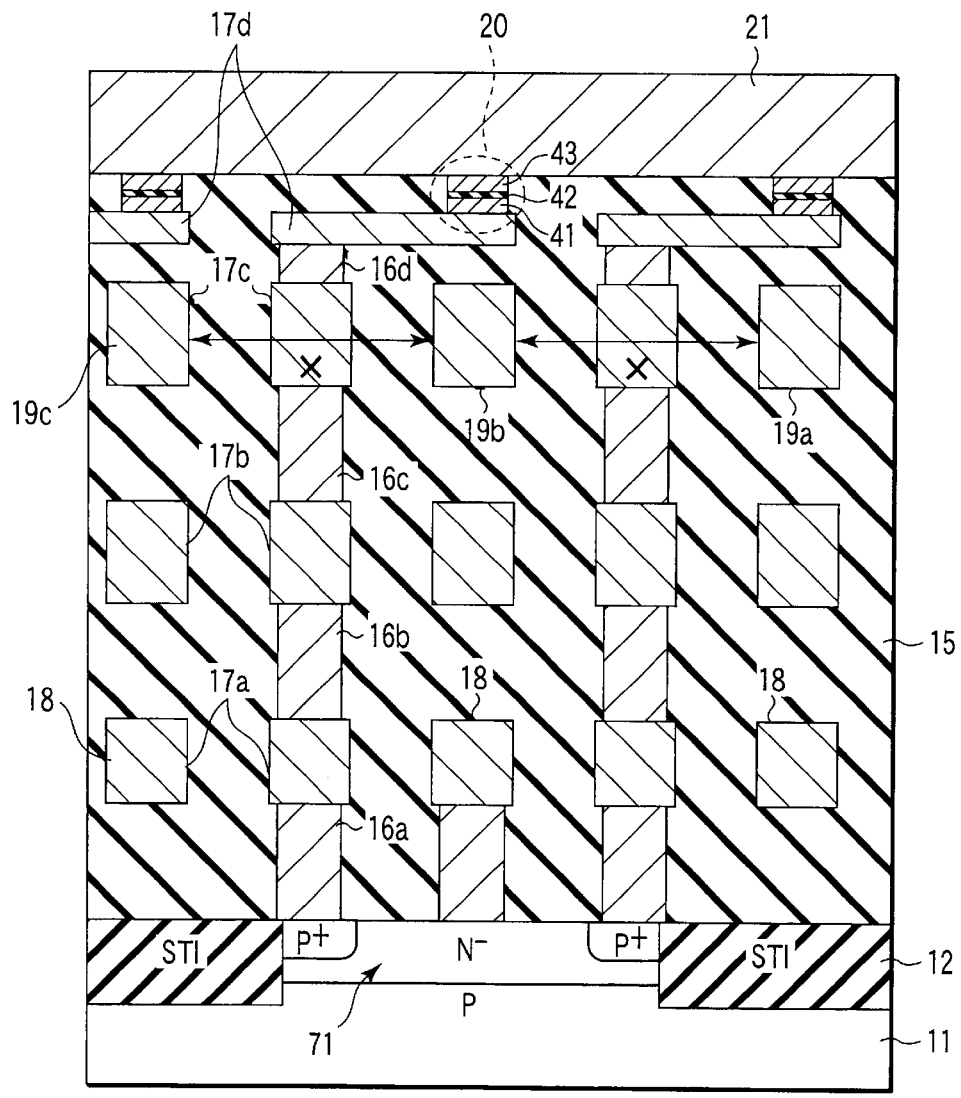
F I G. 13

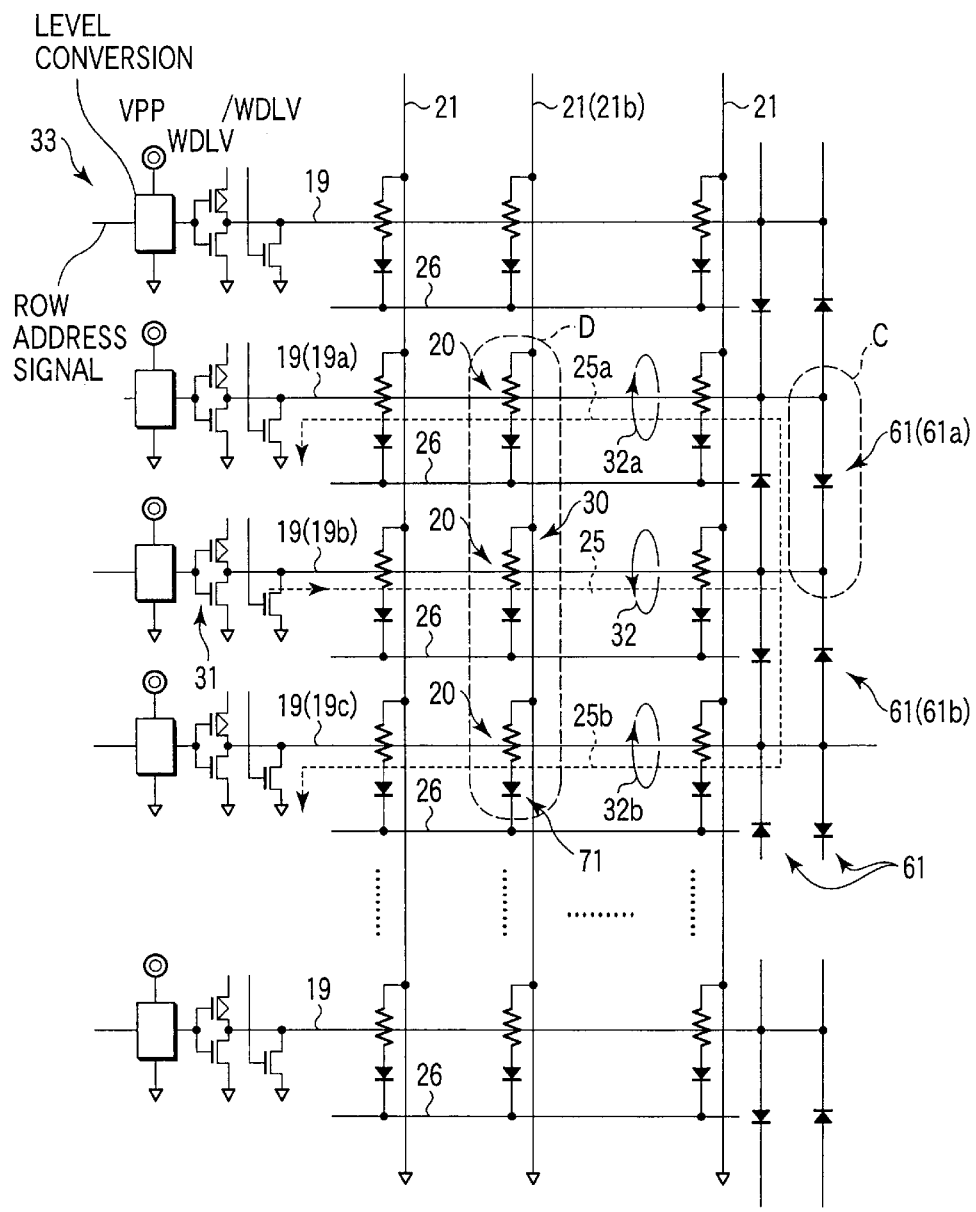
F I G. 15

SEMICONDUCTOR MEMORY DEVICE

CROSS-REFERENCE TO RELATED APPLICATIONS

This application is based upon and claims the benefit of priority from the prior Japanese Patent Applications No. 2000-399223, filed Dec. 27, 2000; and No. 2001-373071, filed Dec. 6, 2001, the entire contents of both of which are incorporated herein by reference.

BACKGROUND OF THE INVENTION

1. Field of the Invention

The present invention relates to a semiconductor memory device and more specifically to write wirings of a magnetic random access memory (MRAM) which uses tunneling magneto resistive (TMR) elements as memory elements.

2. Description of the Related Art

In recent years, MRAM cells have been proposed which utilize the tunneling magneto resistive (hereinafter abbreviated as TMR) effect.

FIG. 17 shows an equivalent circuit diagram of a prior-art semiconductor device. FIG. 18 is a schematic sectional view of a TMR element.

As shown in FIG. 18, a bit line 21 and a pair of word lines 19 and 20 are arranged so that they intersect with each other. At the intersection of the bit line 21 and the write word line 19 is placed a TMR element 20, which has one end connected to the bit line 21 and one other end connected to a transistor 13. The gate electrode of the transistor 13 forms the read word line 26.

The TMR element 20 is formed into a three-layer structure consisting of two magnetic layers and a non-magnetic layer sandwiched between the magnetic layers. That is, as shown in FIG. 18, the TMR element 20 is formed from a magnetization fixing layer 41 connected with a lower electrode 17, a magnetic recording layer 43 connected with the bit line 21 by an upper electrode (not shown), and a thin tunnel junction layer 42 sandwiched between the upper and lower layers.

The magnetization fixing layer 41, formed from an antiferromagnetic layer and ferromagnetic layer, is referred to as the pin layer because the magnetization is fixed in one direction. On the other hand, the magnetic recording layer 43, consisting of a ferromagnetic layer, is referred to as the memory layer because the direction of magnetization can be changed freely and hence data can be stored. The direction of magnetization in the magnetic recording layer 43 can be changed by a composite magnetic field resulting from a current in the bit line 21 and a current in the write word line 19.

FIG. 19 illustrates, in sectional view, a prior-art semiconductor memory device. As shown in this diagram, a semiconductor substrate (or a well) 11 of, for example, p-type conductivity is selectively formed with device isolation regions 12 of shallow trench isolation (STI) structure and MOSFETs 13 having n-type source/drain regions 14. The gate electrode of each MOSFET 13 forms a read word line 26. First contacts 16a are formed in an insulating layer 15 formed over the semiconductor substrate 11 so that they connect to the source/drain regions 14. First wirings 17a are formed on the first contacts 16a. Likewise, second, third and fourth contacts 16b, 16c and 16d and second, third and fourth wirings 17b, 17c and 17d are formed in the insulating layer 15. Part of the first wirings 17a form ground (GND) lines 18. Part of the third wirings 17c form write word lines 19a, 19b and 19c. To each of the fourth wirings 17d is connected a TMR element 20 which is connected at the other end to a bit line 21.

Next, the read/write operation of the semiconductor memory device will be described briefly.

To write a 1 or 0 into the TMR element 20, the corresponding word line 19 and bit line 21 are selected and driven, so that currents flow in the selected word and bit lines to produce magnetic fields. Thereby, the selected cell (TMR element), placed at the intersection of the selected word and bit lines, is subjected to a composite magnetic field which is of such intensity as to allow the reversal of magnetization to occur in the TMR element 20. As a result, data is written into the selected TMR element.

When the magnetization fixing layer 41 and the magnetic recording layer 43 are magnetized in the same direction, the resistance of the tunneling junction layer 42 is minimized. This state can be used to store a 1. On the other hand, when the magnetization fixing layer 41 and the magnetic recording layer 43 are magnetized in opposite directions, the resistance of the tunneling junction layer 42 is maximized. This state can be used to store a 0. That is, in the MRAM, the difference in the tunnel resistance is used to store binary digits of one and zero.

To read information written into the TMR element 20, on the other hand, the corresponding read word line 26 and bit line 21 are selected, whereupon current flows from the bit line 21 through the corresponding MOSFET 13 to the corresponding ground line 18. The peripheral circuit can discriminate between stored information 1 and 0 by sensing (the magnitude of the current which depends on) the tunnel resistance.

BRIEF SUMMARY OF THE INVENTION

According to a first aspect of the present invention, there is provided a semiconductor memory device comprising: a plurality of first wirings extending in a first direction; a plurality of memory elements connected with the first wirings; a plurality of second wirings extending in a second direction different from the first direction, the second wirings being disposed opposite to the first wirings with the memory elements interposed between the first and second wirings, the second wirings being spaced from the memory elements; and first transistors or diodes connected between two adjacent of the second wirings.

According to a second aspect of the present invention, there is provided a semiconductor memory device comprising: a plurality of first wirings extending in a first direction; a plurality of memory elements connected with the first wirings; a plurality of second wirings extending in a second direction different from the first direction, the second wirings being disposed opposite to the first wirings with the memory elements interposed between the first and second wirings, the second wirings being spaced from the memory elements; and second transistors or diodes connected between two adjacent of the second wirings.

BRIEF DESCRIPTION OF THE SEVERAL VIEWS OF DRAWING

FIG. 2 is a sectional view of the A region of the semiconductor memory device of FIG. 1;

FIGS. 5A and 5B are sectional views of a double tunneling junction structure used in the embodiments of the present invention;

FIG. 10 is a sectional view of the C region of the semiconductor memory device of FIG. 9;

FIG. 11 is a circuit diagram of another semiconductor memory device according to the second embodiment of the present invention;

FIG. 12 is a circuit diagram of a semiconductor memory device according to a third embodiment of the present invention;

FIG. 13 is a sectional view of the D region of the semiconductor memory device of FIG. 12;

FIG. 15 is a circuit diagram of a semiconductor memory device according to a fourth embodiment of the present invention;

DETAILED DESCRIPTION OF THE INVENTION

Figure 19:
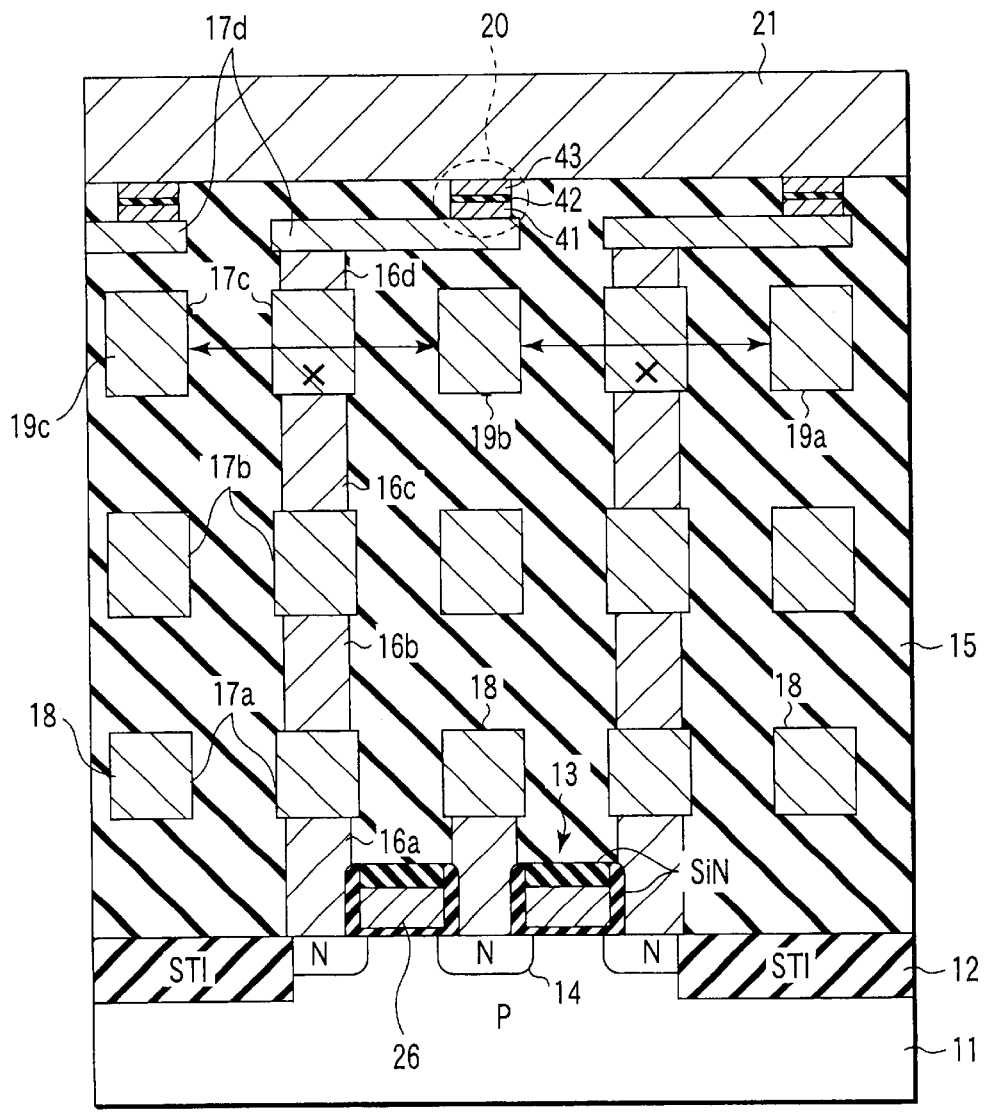
FIG. 19 is a sectional view of the conventional semiconductor memory device.

With conventional semiconductor memory devices, the cell-to-cell spacing has been reduced with advances in fine pattern technology; that is, the spacing between adjacent write word lines, indicated at X in FIG. 19, has fallen below 1 μm. Therefore, at the time of writing data, a magnetic field produced by a current that flows in, for example, the write word line 19b would reach the next adjacent write word lines 19a and 19b, resulting in a problem of crosstalk to adjacent cells.

The present invention is directed to a semiconductor memory device in the form of a magnetic random access memory (MRAM) using tunneling magneto resistive (TMR) elements. This MRAM is a memory cell array structure in which a large number of memory cells having TMR elements are arranged in a matrix. The MRAM has address decoders and sense circuits formed on the outside of the cell array to allow an individual memory cell to be accessed for reading or writing.

Hereinafter, the embodiments of the present invention will be described with reference to the accompanying drawings, wherein like reference numerals designate like or corresponding parts throughout several views.

[First Embodiment]

The first embodiment is configured such that a transistor is connected between each write word line and the next adjacent write word line so that, at the time of writing into a memory cell, a current will flow in the opposite direction in the write word lines adjacent to the write word line associated with that memory cell.

Figure 1:
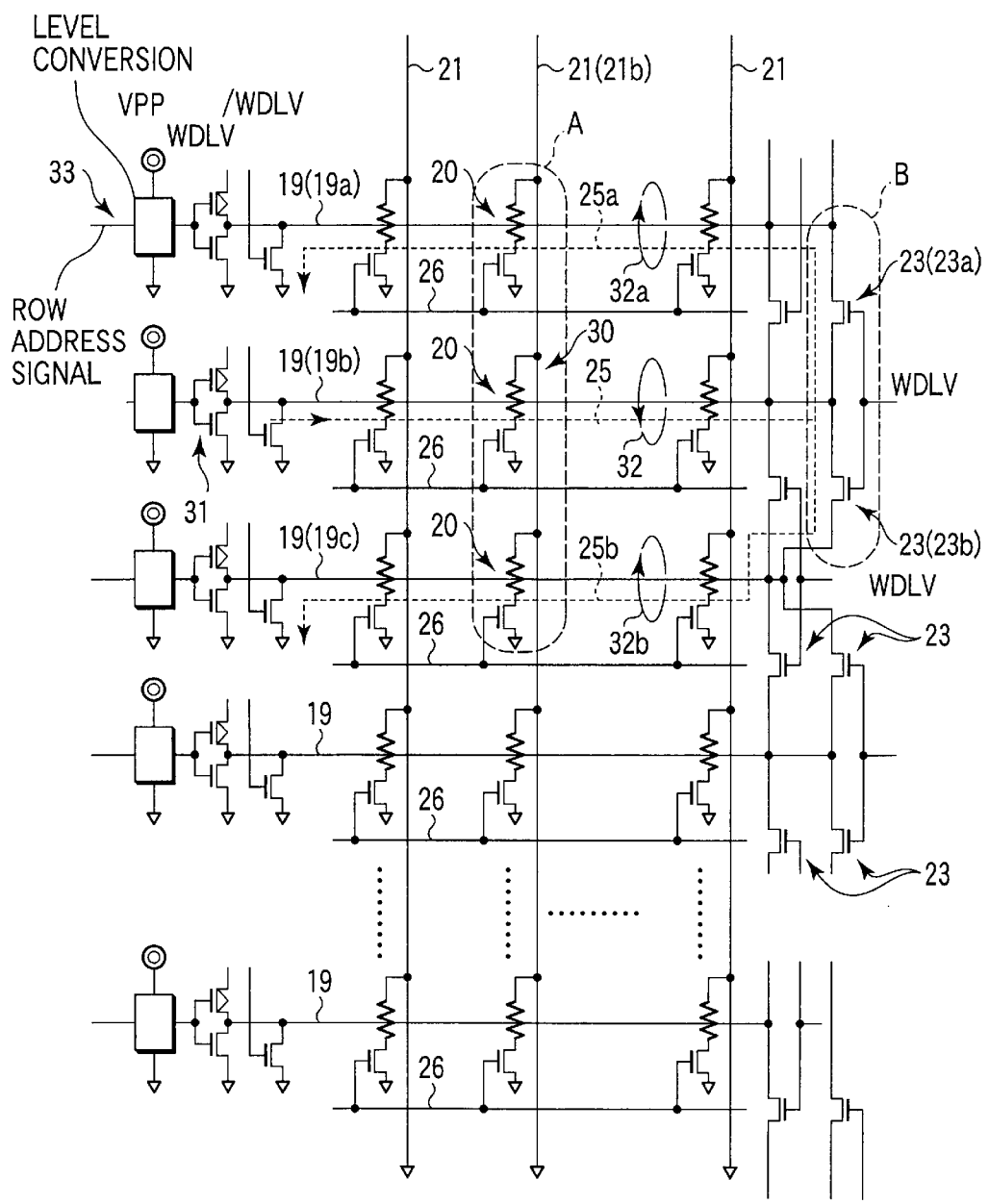
FIG. 1 is a circuit diagram of a semiconductor memory device according to a first embodiment of the present invention.
Figure 3:
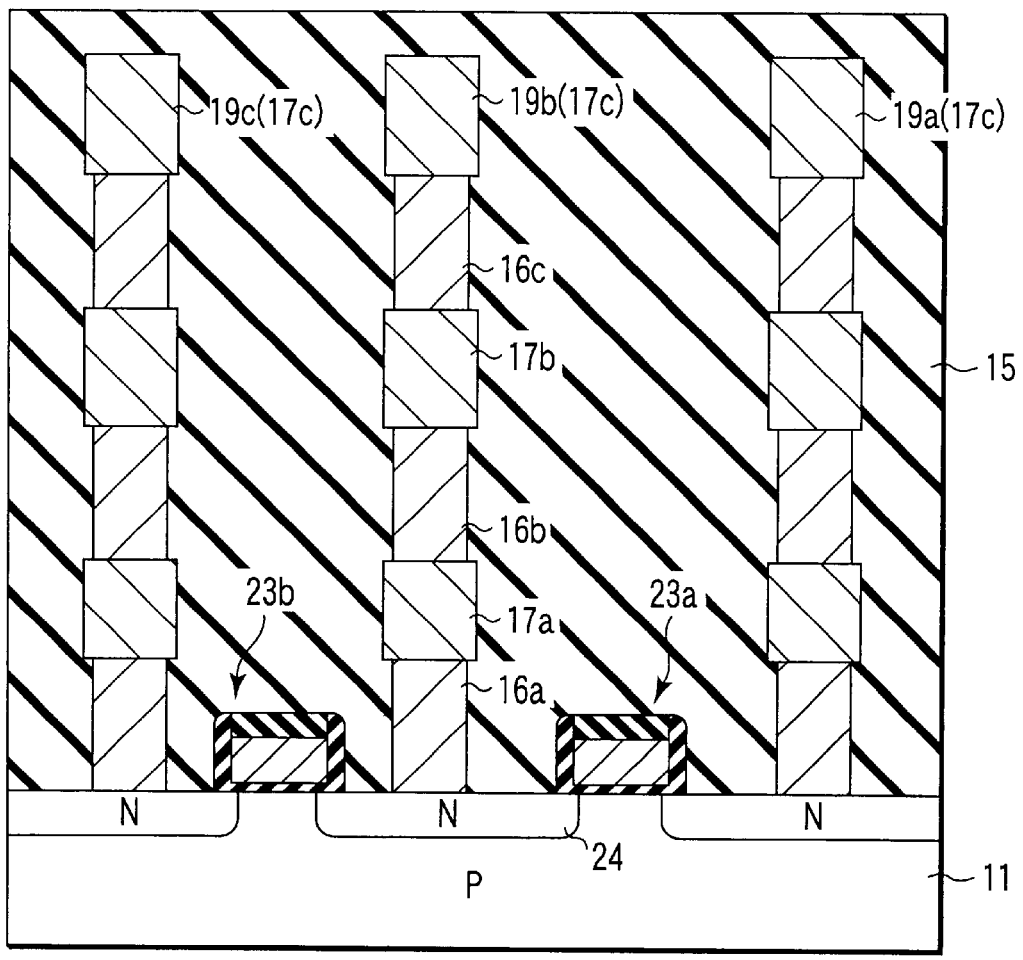
FIG. 3 is a sectional view of the B region of the semiconductor memory device of FIG. 1.

FIG. 1 is a circuit diagram of a semiconductor memory device according to the first embodiment of the present invention. FIG. 2 is a sectional view of a region A shown in FIG. 1. FIG. 3 is a sectional view of a B region shown in FIG. 1.

As shown in FIG. 1, bit lines 21 and word lines 19 (26) are arranged in rows and columns, respectively. The word lines comprise write word lines 19 and read word lines 26. TMR elements 20 are located at the intersections of the bit lines 21 and the write word lines 19 to form a memory cell array. Outside the memory cell array area, each write word line 19 is connected at one end to a current driver circuit 33 and at the other end to transistors (e.g., MOSFETs) 23.

An A region shown in FIG. 1 will be described next. The A region shows the standard MRAM structure. That is, as shown in FIG. 2, a semiconductor substrate (or a well) 11 of, for example, p-type conductivity is selectively formed with device isolation regions 12 of shallow trench isolation (STI) structure and MOSFETs 13 having n-type source/drain regions 14. The MOSFETs are read switching elements and their gate electrodes form the read word lines 26. First contacts 16a are formed in an insulating layer 15 formed over the semiconductor substrate 11 so that they connect to the source/drain regions 14. First wirings 17a are formed on the first contacts 16a. Likewise, second, third and fourth contacts 16b, 16c and 16d and second, third and fourth wirings 17b, 17c and 17d are formed in the insulating layer 15. Part of the first wirings 17a form ground (GND) lines 18. Part of the third wirings 17c form write word lines 19a, 19b and 19c. To each of the fourth wirings 17d is connected a TMR element 20 which is connected at the other end to a bit line 21.

The B region shown in FIG. 1 will be described next. This region is characteristic of the first embodiment of the present invention. That is, as shown in FIG. 3, a third contact 16c, a second wiring 17b, a second contact 16b, a first wiring 17a and a first contact 16a are connected in this order to each of the write word lines 19a, 19b, and 19c.

Each of the first contacts 16a is connected to a corresponding one of the source/drain regions 24 of transistors 23a and 23b formed in the semiconductor substrate 11. Namely, the transistor 23a is introduced between the adjacent write word lines 19a and 19b, and the transistor 23b is introduced between the adjacent write word lines 19b and 19c.

Next, the structure of the TMR elements 20 will be described. The TMR element 20 is composed, as shown in FIG. 2, of a magnetization fixing layer (magnetic layer) 41, a tunnel junction layer (nonmagnetic layer) 42, and a magnetic recording layer (magnetic layer) 43. This element may be of either the single tunnel junction structure or the double tunnel junction structure, which will be described below.

Figure 4A:
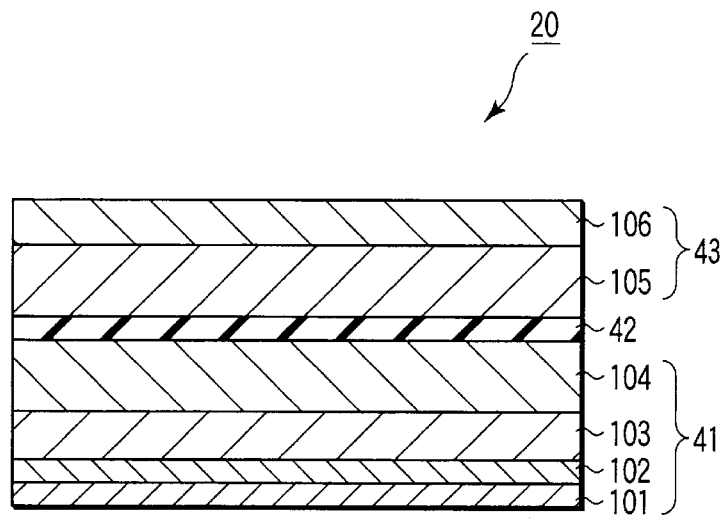
FIGS. 4A and 4B are sectional views of a single tunneling junction structure used in the embodiments of the present invention.
Figure 4B:
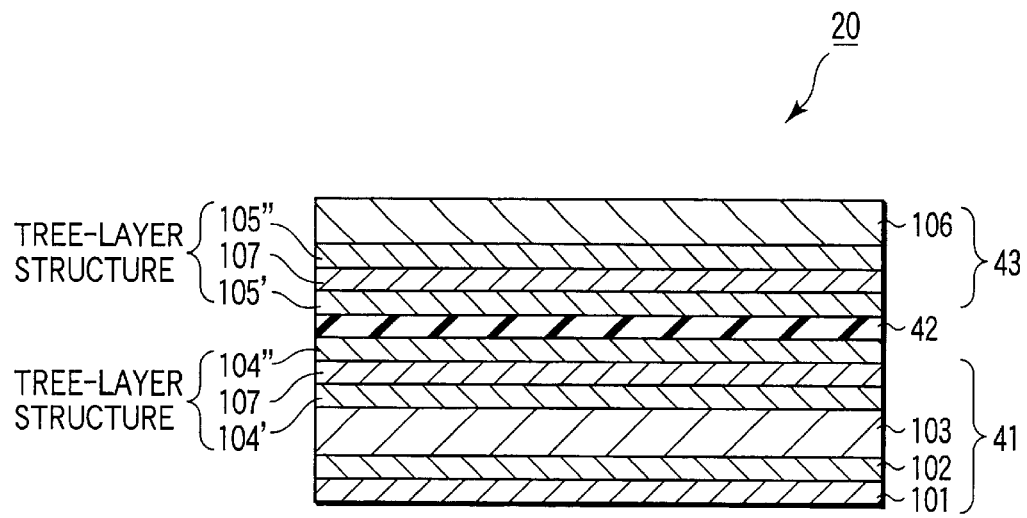

FIGS. 4A and 4B are sectional views of TMR elements of the single tunnel junction structure.

The TMR element 20 shown in FIG. 4A comprises a magnetization fixing layer 41, a tunnel junction layer 42, and a magnetic recording layer 43, which are stacked in this order. The magnetization fixing layer 41 consists of a template layer 101, an initial ferromagnetic layer 102, an antiferromagnetic layer 103, and a reference ferromagnetic layer 104 stacked in this order. The magnetic recording layer 43 consists of a free ferromagnetic layer 105 and a contact layer 106.

The TMR element 20 shown in FIG. 4B likewise comprises the magnetization fixing layer 41, the tunnel junction layer 42, and the magnetic recording layer 43. The magnetization fixing layer 41 is formed from a template layer 101, an initial ferromagnetic layer 102, an antiferromagnetic layer 103, a ferromagnetic layer 104', a nonmagnetic layer 107, and a ferromagnetic layer 104", which are stacked in the order mentioned. The magnetic recording layer 43 is formed from a ferromagnetic layer 105', a nonmagnetic layer 107, a ferromagnetic layer 105" and a contact layer 106, which are stacked in the order mentioned.

In the TMR element shown in FIG. 4B, a three-layer structure of ferromagnetic layer 104', nonmagnetic layer 107, and ferromagnetic layer 104" is introduced in the magnetization fixing layer 41. Moreover, a three-layer structure of ferromagnetic layer 105', nonmagnetic layer 107 and ferromagnetic layer 105" is introduced in the magnetic recording layer 43. This configuration makes the formation of magnetic poles in the ferromagnetic material more difficult than in the TMR element shown in FIG. 4A and is therefore more suitable for scaling down the dimensions of cells.

The double tunnel junction structures of TMR elements are illustrated in FIGS. 5A and 5B.

The TMR element of FIG. 5A comprises a first magnetization fixing layer 51, a first tunnel junction layer 52, a magnetic recording layer 43, a second tunnel junction layer 53, and a second magnetization fixing layer 54, which are stacked in the order mentioned. The first magnetization fixing layer 51 consists of a template layer 101, an initial ferromagnetic layer 102, an antiferromagnetic layer 103, and a reference ferromagnetic layer 104 which are stacked in the order mentioned. The second magnetization fixing layer 54 consists of a reference ferromagnetic layer 104, an antiferromagnetic layer 103, an initial ferromagnetic layer 102, and a contact layer 106, which are stacked in the order mentioned.

The TMR element of FIG. 5B likewise comprises a first magnetization fixing layer 51, a first tunnel junction layer 52, a magnetic recording layer 43, a second tunnel junction layer 53, and a second magnetization fixing layer 54, which are stacked in the order mentioned. The first magnetization fixing layer 51 consists of a template layer 101, an initial ferromagnetic layer 102, an antiferromagnetic layer 103, and a reference ferromagnetic layer 104, which are stacked in the order mentioned. The magnetic recording layer 43 consists of a ferromagnetic layer 43', a nonmagnetic layer 107, and a ferromagnetic layer 43", which are stacked in the order mentioned. The second magnetization fixing layer 54 consists of a ferromagnetic layer 104', a nonmagnetic layer 107, a ferromagnetic layer 104" an antiferromagnetic layer 103, an initial ferromagnetic layer 102, and a contact layer 106, which are stacked in the order mentioned.

The TMR element of FIG. 5B is configured such that a three-layer structure is introduced in each of the second magnetization fixing layer 54 and the magnetic recording layer 43. This configuration makes the formation of magnetic poles in the ferromagnetic material more difficult than in the TMR element shown in FIG. 5A and is therefore more suitable for scaling down the dimensions of cells.

In comparison with the TMR element of the single tunnel junction structure, the TMR element of the double tunnel junction structure has a higher magneto resistance (MR) ratio (the ratio in resistance of the "1" state to the "0" state) when the same external bias is applied and can therefore be operated from higher biases. This is advantageous in reading data from cells to the outside.

The TMR elements described above are formed using the following materials:

For the magnetization fixing layers 41, 51 and 54 and the magnetic recording layer 43, it is desirable to use (1) Fe, Co, Ni, or their alloys, (2) magnetites large in spin polarizability, (3) oxides, such as $CrO_2$, $RXMnO_{3-y}$, etc., and (4) Heusler's alloys, such as NiMnSb, PtMnSb, etc. Nonmagnetic elements, such as Ag, Cu, Au, Al, Mg, Si, Bi, Ta, B, C, O, N, Pd, Pt, Zr, Ir, W, Mo, Nb, etc., may be contained in some quantity in the above magnetic materials as long as their ferromagnetic property is retained.

For the antiferromagnetic layer 103 forming part of the magnetization fixing layer 41, it is desirable to use Fe—Mn, Pt—Mn, Pt—Cr—Mn, Ni—Mn, Ir—Mn, NiO, or $Fe_2O_3$.

For the tunnel junction layers 42, 52 and 53, a dielectric material, such as $Al_2O_3$, $SiO_2$, MgO, AlN, $Bi_2O_3$, $MgF_2$, $CaF_2$, $SrTiO_2$, or $AlLaO_3$, can be used. Oxygen, nitrogen or fluorine deficiency is allowed to be present in these dielectric materials.

Next, the operation of writing data into the semiconductor memory device of the first embodiment will be described.

Figure 6:
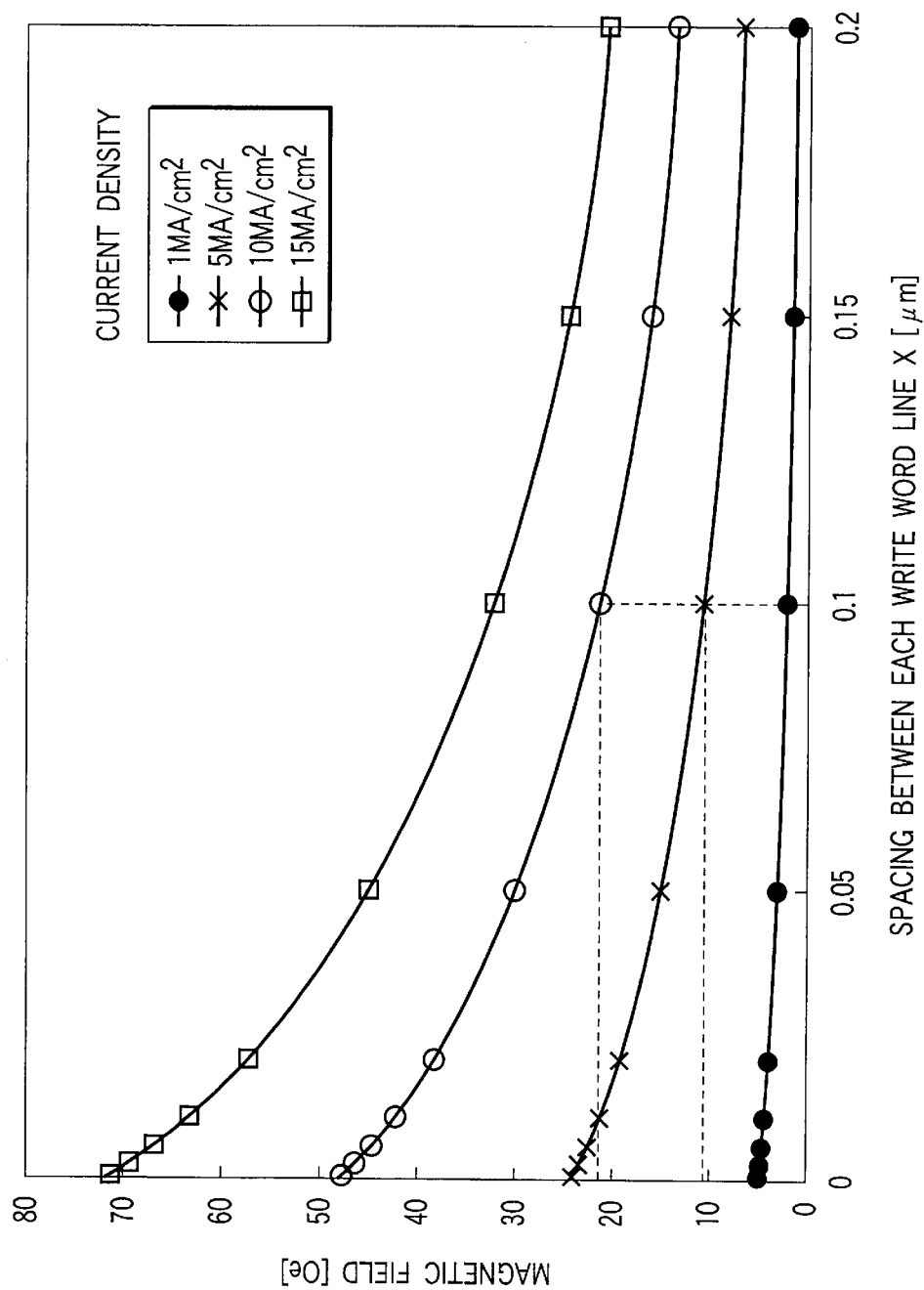
FIG. 6 shows current magnetic field versus spacing between adjacent write word lines for different values of current density.

FIG. 6 shows magnetic field intensity versus spacing between every two adjacent write word lines. Here, the sectional area of the write wirings (the write word lines 19 and the bit lines 21) is assumed to be $(0.1 \times 0.1)$ $\mu m^2$.

As can be seen from FIG. 6, the intensity of the magnetic field generated varies with the spacing X between each write word line and the current density in the write word lines. That is, the intensity of the magnetic field increases as the spacing X between each write word line decreases. Also, the intensity of the magnetic field increases as the current density increases.

Figure 7:
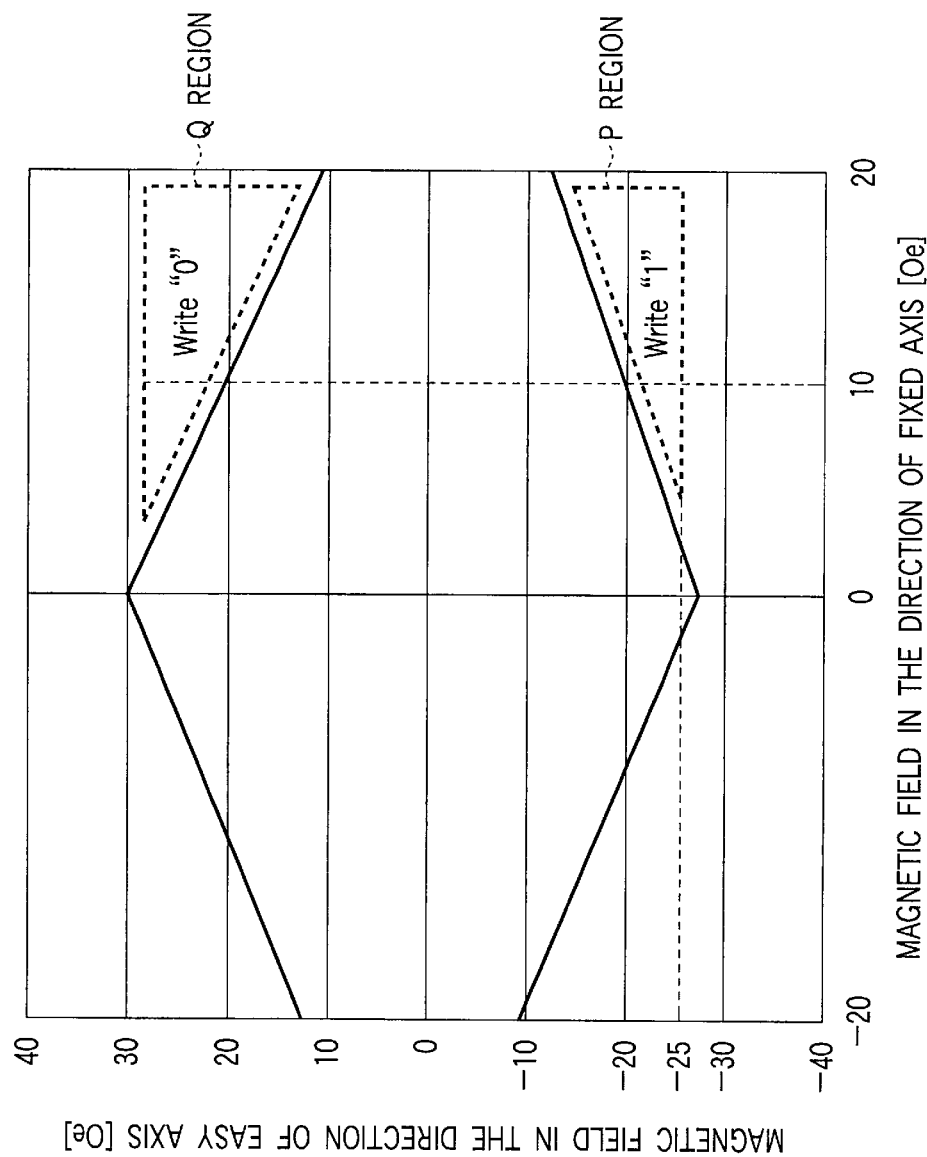
FIG. 7 shows the asteroid curve of a TMR element.

FIG. 7 shows the asteroid curve of the TMR element. In this diagram, the horizontal axis represents the intensity of the magnetic field in the direction of the fixed axis and the vertical axis represents the intensity of the magnetic field in the direction of the easy axis.

Hereinafter, the writing of information "1" and "0" will be described using the asteroid curve. In the description which follows, the spacing X between each write word line is assumed to be 0.1 $\mu$m. The wirings in the direction of the fixed axis are assumed to be the write word lines 19 and the wirings in the direction of the easy axis are assumed to be the bit lines 21.

To write "1", it is required to produce a composite magnetic field the intensity of which lies within the P region. That is, assuming that the write word line 19 is driven to produce a magnetic field having an intensity of, say, 10 Oe, it is required to drive the bit line to produce a magnetic field of the order of 20 to 25 Oe. To this end, the write word line is simply driven with a current the density of which is 5 $MA/cm^2$ and the bit line with a current the density of which is 10 $MA/cm^2$ (see FIG. 6). By producing a composite magnetic field the intensity of which lies within the P region in this manner, the direction of magnetization can be changed to write "1".

To write 0, on the other hand, it is required to generate a composite magnetic field the intensity of which lies within the Q region. That is, assuming that the write word line 19 is driven to produce a magnetic field having an intensity of, say, 10 Oe, it is required to drive the bit line to produce a magnetic field of the order of 20 to 30 Oe. To this end, the write word line is simply driven with a current the density of which is 5 MA/cm$^2$ and the bit line with a current the density of which is 10 MA/cm$^2$ (see FIG. 6). By producing a composite magnetic field the intensity of which lies within the Q region in this manner, the direction of magnetization can be changed to write "0".

Next, a description is given of the operation of writing data into a cell with a transistor connected between each write word line.

First, in the arrangement of FIG. 1, to write data into a certain cell 30, the bit line 21b and the write word line 19b are selected and then current driven so that a composite magnetic field is produced which has an intensity that lies within the P region or the Q region shown in FIG. 7. When a transistor 31 of the current driver 33 is turned on in order to cause a current 25 to flow in a first direction in the write word line 19b, transistors 23a and 23b are also turned on. As a result, the current 25 in the write word line 19b passes through the transistors 23a and 23b and flows as currents 25a and 25b in the respective write word lines 19a and 19c each adjacent to the write word line 19b. The currents 25a and 25b are in the opposite direction (a second direction) to the current 25.

Thus, magnetic fields 32a and 32b resulting from the currents 25a and 25b in the write word lines 19a and 19b are each opposite in direction to a magnetic field 32 produced by the current 25 in the word line 19b. For this reason, even if the magnetic field 32 produced by the write word line 19b reaches the write word lines 19a and 19b, it will be canceled by the magnetic fields 32a and 32b produced by the lines 19a and 19b.

The data written into the TMR element in the aforementioned manner can be read through the standard method. That is, as shown in FIG. 2, the MOSFET 13 connected to the TMR element 20 in which data is stored is simply turned on so that a current path is formed which extends from the bit line 21 through the TMR element, the contacts 16a, 16b, 16c and 16d, the wirings 17a, 17b, 17c and 17d, and the source/drain regions 14 to ground. The resistance of the TMR element can be read to discriminate between "1" and "0".

According to the first embodiment, the connection of transistors between each write word line allows, when writing data into a TMR element, currents to flow in write word lines 19a and 19c, adjacent to the write word line 19b associated with that TMR element, in the reverse direction to that in the line 19b. Therefore, the magnetic field resulting from the write current 25 is canceled by magnetic fields 32a and 32b resulting from the reverse currents 25a and 25b. As a result, it becomes possible to prevent adjacent cells from being written into in error, allowing the crosstalk problem to be resolved.

Figure 8:
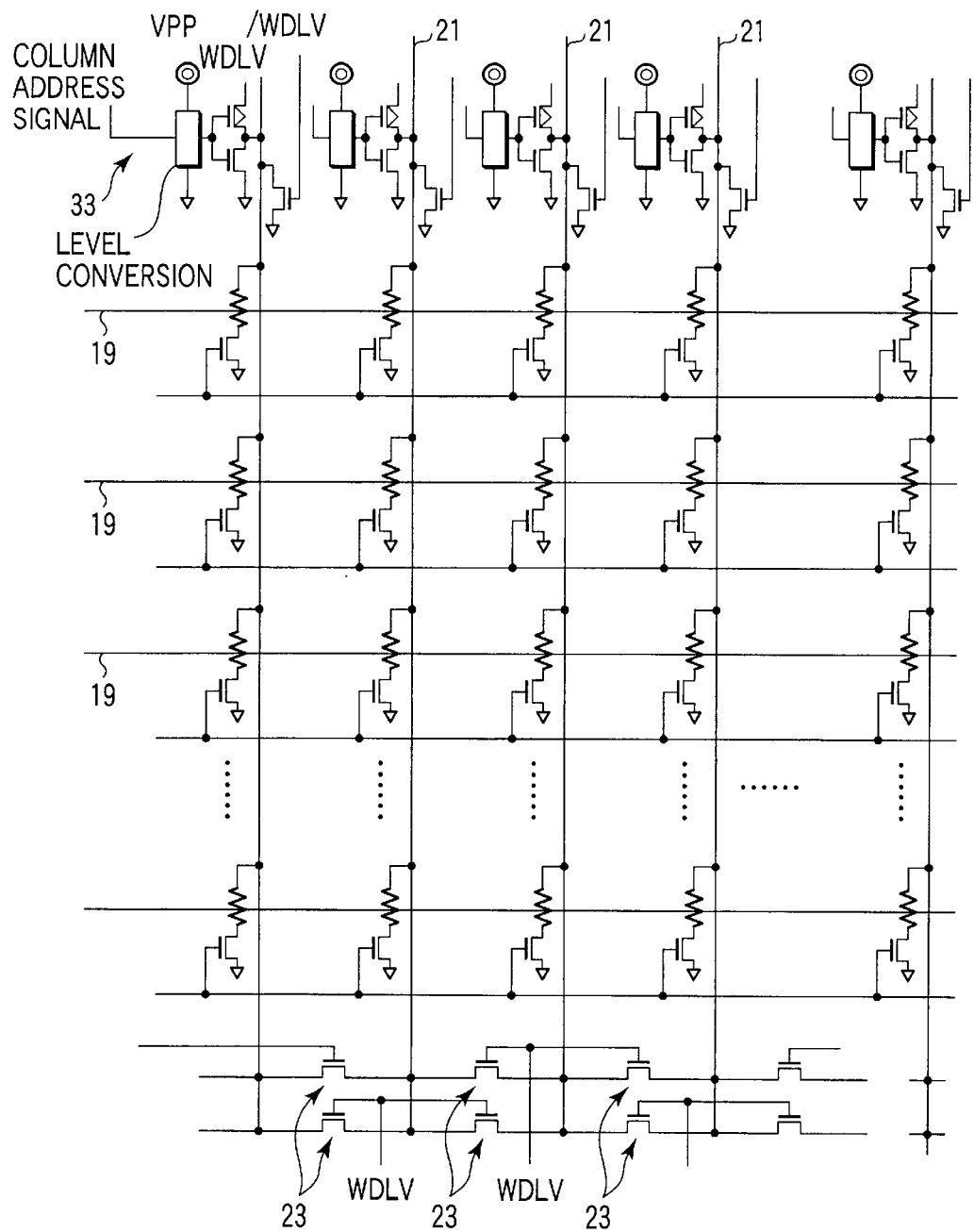
FIG. 8 is a circuit diagram of another semiconductor memory device according to the first embodiment of the present invention.

In the first embodiment, transistors 23 may be connected between each bit line 21 as shown in FIG. 8. Furthermore, the arrangements of FIGS. 1 and 8 may be used in combination. These arrangements will also provide the same advantages as described in the first embodiment.

[Second Embodiment]

The second embodiment is arranged such that diodes are connected between each write word line in place of the transistors in the first embodiment.

Figure 9:
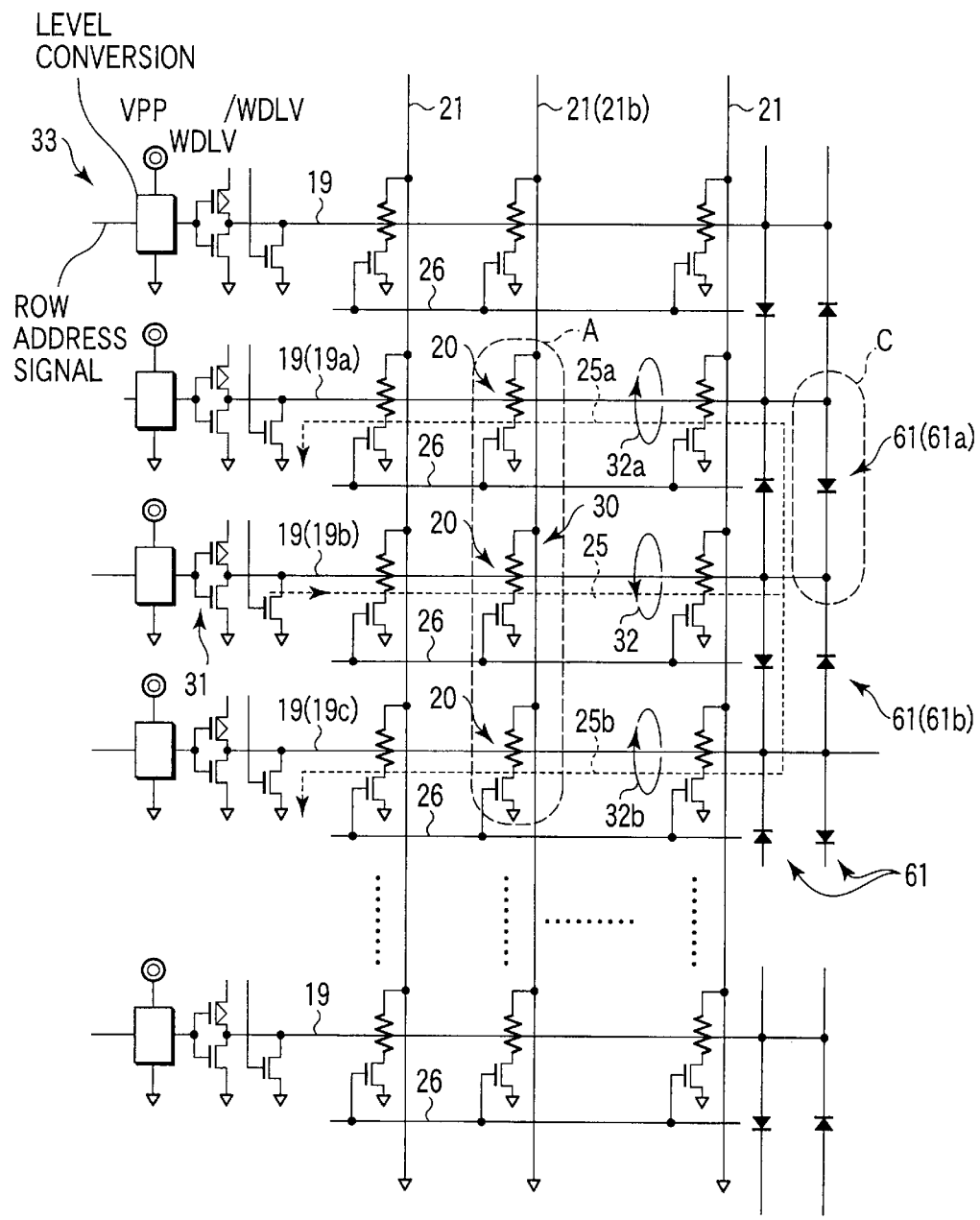
FIG. 9 is a circuit diagram of a semiconductor memory device according to a second embodiment of the present invention.

FIG. 9 is a circuit diagram of a semiconductor memory device according to the second embodiment of the present invention. FIG. 10 is a sectional view of a region C shown in FIG. 9. The sectional view of the A region shown in FIG. 9 remains unchanged from FIG. 2 and hence description thereof is omitted.

As shown in FIG. 9, bit lines 21 and word lines 19 (26) are arranged in rows and columns, respectively. The word lines comprise write word lines 19 and read word lines 26. TMR elements 20 are located at the intersections of the bit lines 21 and the write word lines 19 to form a memory cell array. Outside the memory cell array area, each write word line 19 is connected at its one end to a current driver circuit 33 and at its other end to diodes 61.

The C region shown in FIG. 9 will be described next. This region is characteristic of the second embodiment of the present invention. That is, as shown in FIG. 10, a third contact 16c, a second wiring 17b, a second contact 16b, a first wiring 17a and a first contact 16a are connected in this order to each of the write word lines 19a and 19b.

Each of the first contacts 16a is connected to a PN junction diode 61 formed in the semiconductor substrate 11. Namely, the diode 61 is introduced between the adjacent write word lines 19a and 19b.

The write operation of the second embodiment will be described hereinafter.

First, in the arrangement of FIG. 9, to write data into the TMR element 20 in a certain cell 30, the bit line 21b and the write word line 19b are selected and then current driven so that a composite magnetic field is generated which has an intensity that lines within the P region or the Q region shown in FIG. 7. When a forward bias voltage is applied to a transistor 31 of the current driver 33 in order to cause a current 25 to flow in a first direction in the write word line 19b, the current 25 flows through the diodes 61a and 61b as well. As a result, currents 25a and 25b respectively flow in the write word lines 19a and 19c in the opposite direction (a second direction) to the current 25.

Thus, magnetic fields 32a and 32b resulting from the currents 25a and 25b in the write word lines 19a and 19b are each opposite in direction to a magnetic field 32 produced by the current 25 in the word line 19b. For this reason, even if the magnetic field 32 produced by the write word line 19b reaches the write word lines 19a and 19b, it will be canceled by the magnetic fields 32a and 32b produced by the lines 19a and 19b.

The information written into the TMR element 20 can be read in the same manner as in the first embodiment; thus, description of the read operation is omitted.

The second embodiment can provide the same advantages as the first embodiment.

In the second embodiment, diodes 61 may be connected between each bit line 21 as shown in FIG. 11. Furthermore, the arrangements of FIGS. 9 and 11 may be used in combination. These arrangements will also provide the same advantages as described in the second embodiment.

[Third embodiment]

The third embodiment is a modification of the first embodiment in which the transistors as read switching elements are replaced by diodes.

FIG. 12 is a circuit diagram of a semiconductor memory device according to the third embodiment of the present invention. FIG. 13 is a sectional view of a region D shown in FIG. 12.

As shown in FIG. 12, in the B region, as in the first embodiment, the transistor 23a is introduced between adjacent write word lines 19a and 19b and the transistor 23b is introduced between adjacent write word lines 19b and 19c.

As shown in FIG. 13, in the D region, each of the TMR elements 20 located at the intersections of the bit line 21 and the write word lines 19a, 19b and 19c is connected in series with a diode 71.

The write operation of the third embodiment remains unchanged from that of the first embodiment; thus, description thereof is omitted. The read operation of the third embodiment is performed in the following manner. That is, bias voltage is adjusted so that a current will flow in the diode connected with a TMR element into which data has been written and then the resistance of that TMR element is read out. A change in the resistance of the TMR element allows discrimination between "1" and "0".

The third embodiment will also provide the same advantage as the first embodiment.

The third embodiment that uses diodes as switching elements requires less area for the memory cell array than the first and second embodiment that use transistors.

Figure 14:
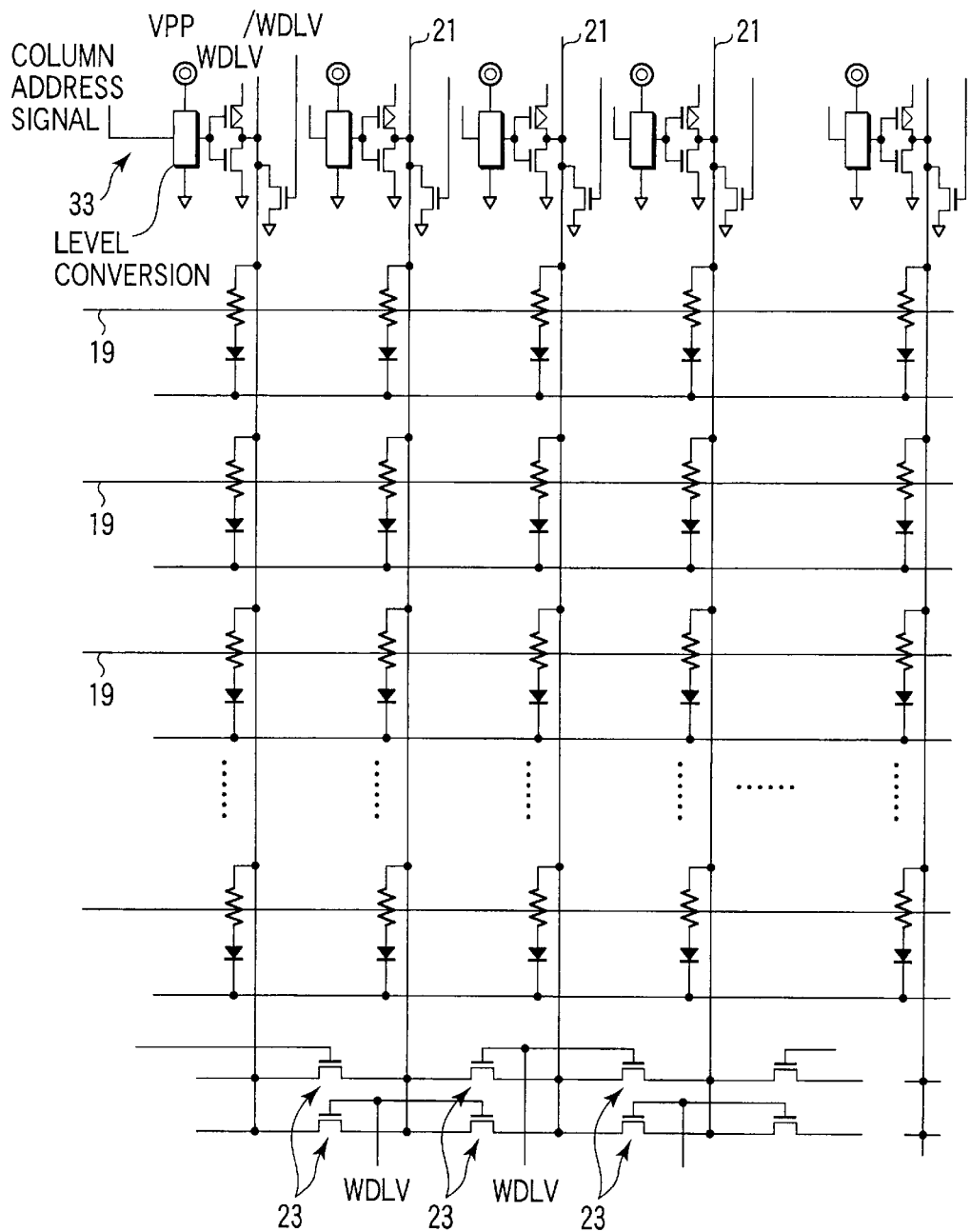
FIG. 14 is a circuit diagram of another semiconductor memory device according to the third embodiment of the present invention.

As shown in FIG. 14, transistors 23 may be introduced between each bit line 21. Furthermore, the arrangements of FIGS. 12 and 14 may be used in combination. These arrangements will also provide the same advantages as described in the third embodiment.

[Fourth embodiment]

The fourth embodiment is a modification of the second embodiment in which the transistors as read switching elements are replaced by diodes.

FIG. 15 is a circuit diagram of a semiconductor memory device according to the fourth embodiment of the present invention. As shown in FIG. 15, in the C region, as in the second embodiment, the diode 61a is introduced between adjacent write word lines 19a and 19b and the diode 61b is introduced between adjacent write word lines 19b and 19c. In the D region, as in the third embodiment, each of the TMR elements 20 located at the intersections of the bit line 21 and the write word lines 19a, 19b and 19c is connected in series with a PN junction diode 71.

The write operation of the fourth embodiment remains unchanged from that of the second embodiment; thus, description thereof is omitted. The read operation of the fourth embodiment is the same as in the third embodiment; thus, description thereof is omitted.

The fourth embodiment will also provide the same advantage as the second embodiment.

The fourth embodiment that uses diodes as switching elements requires less area for the memory cell array than the first and second embodiments that use transistors.

Figure 16:
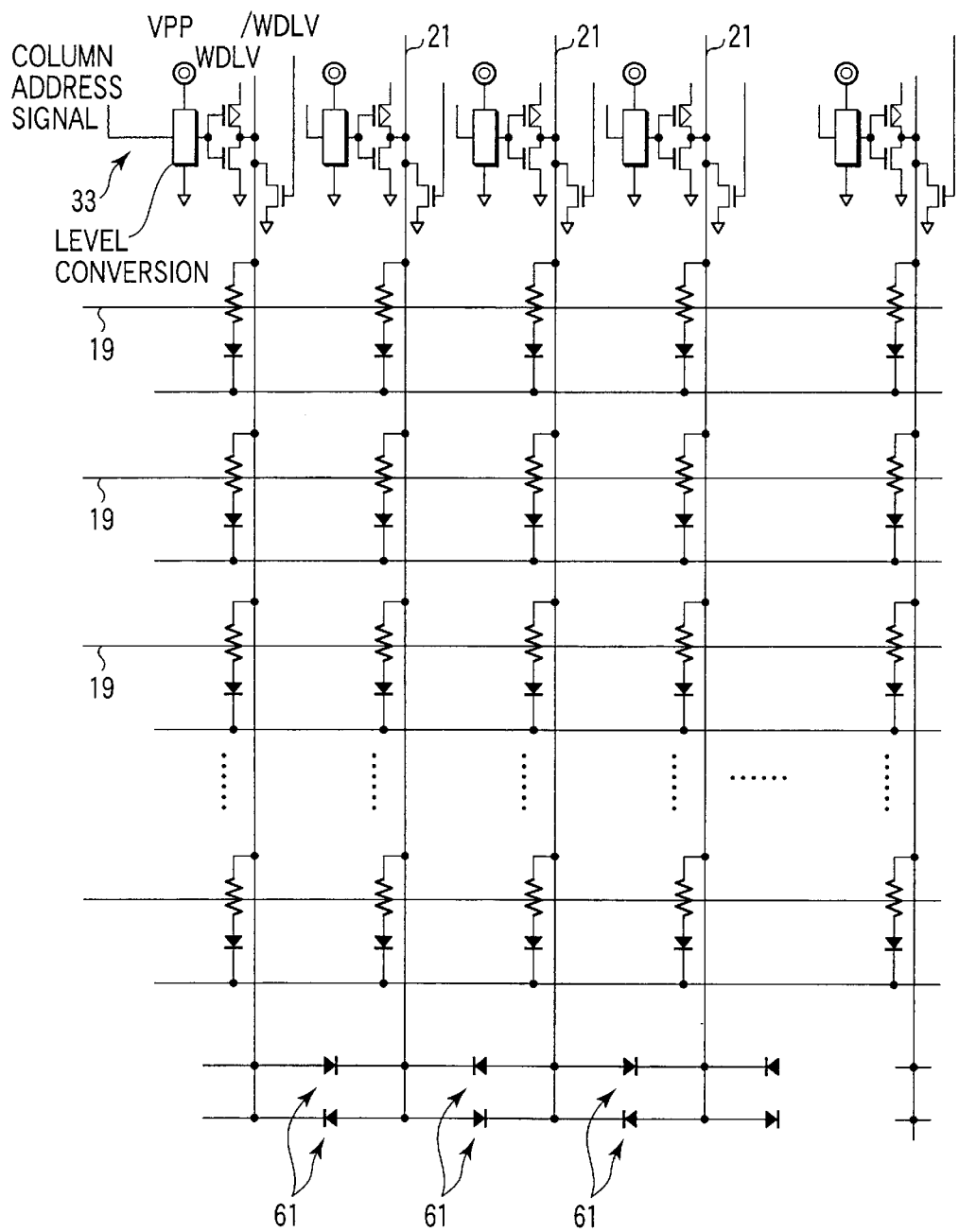
FIG. 16 is a circuit diagram of another semiconductor memory device according to the fourth embodiment of the present invention.
Figure 17:
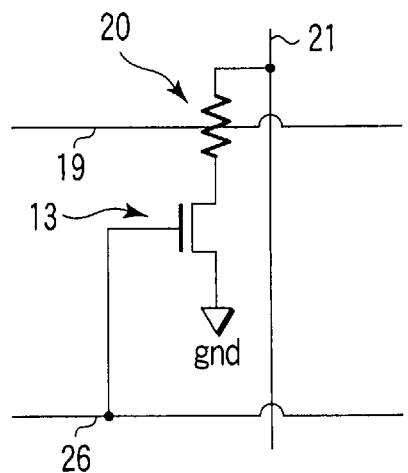
FIG. 17 is a circuit diagram of a conventional semiconductor memory device.
Figure 18:
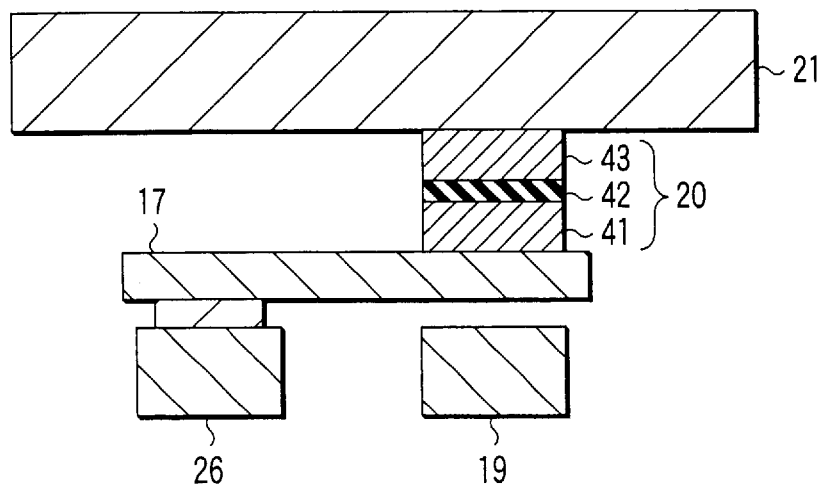
FIG. 18 is a sectional view of the conventional semiconductor memory device of FIG. 17.

As shown in FIG. 16, diodes 61 may be introduced between each bit line 21. Furthermore, the arrangements of FIGS. 15 and 16 may be used in combination. These arrangements will also provide the same advantages as described in the fourth embodiment.

In the embodiments described so far, the TMR elements may be replaced by GMR (Giant Magneto Resistive) elements each of which comprises two magnetic layers and a conductive layer sandwiched between the magnetic layers. In addition, the memory cell array structure may be modified in various ways as needed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a plurality of first wirings extending in a first direction;
   a plurality of memory elements connected with the first wirings;
   a plurality of second wirings extending in a second direction different from the first direction, said second wirings being disposed opposite to the first wirings with the memory elements interposed between the first and second wirings, said second wirings being spaced from the memory elements; and
   first transistors or diodes connected between two adjacent of the second wirings.

2. A semiconductor memory device comprising:
   a plurality of first wirings extending in a first direction;
   a plurality of memory elements connected with the first wirings;
   a plurality of second wirings extending in a second direction different from the first direction, said second wirings being disposed opposite to the first wirings with the memory elements interposed between the first and second wirings, said second wirings being spaced from the memory elements; and
   second transistors or diodes connected between two adjacent of the second wirings.

3. The semiconductor memory device according to claim 1, further comprising second transistors or diodes connected between two adjacent of the second wirings.

4. The semiconductor memory device according to claim 2, further comprising first transistors or diodes connected between two adjacent of the second wirings.

5. The semiconductor memory device according to claim 1, further comprising third transistors or diodes each connected with the memory elements.

6. The semiconductor memory device according to claim 2, further comprising third transistors or diodes each connected with the memory elements.

7. The semiconductor memory device according to claim 1, wherein each of the memory elements is a TMR element formed of at least three layers of a first magnetic layer, a second magnetic layer, and a nonmagnetic layer.

8. The semiconductor memory device according to claim 2, wherein each of the memory elements is a TMR element formed of at least three layers of a first magnetic layer, a second magnetic layer, and a nonmagnetic layer.

9. The semiconductor memory device according to claim 7, wherein the TMR element is a single junction structure including one nonmagnetic layer or a double junction structure including two nonmagnetic layers.

10. The semiconductor memory device according to claim 8, wherein the TMR element is a single junction structure including one nonmagnetic layer or a double junction structure including two nonmagnetic layers.

11. The semiconductor memory device according to claim 1, wherein each of the memory elements is a GMR element formed of at least three layers of a first magnetic layer, a second magnetic layer, and a conductive layer.

12. The semiconductor memory device according to claim 2, wherein each of the memory elements is a GMR element formed of at least three layers of a first magnetic layer, a second magnetic layer, and a conductive layer.

13. The semiconductor memory device according to claim 1, wherein the first transistors or diodes are located outside a memory cell array region in which the memory elements are arranged.

14. The semiconductor memory device according to claim 2, wherein the second transistors or diodes are located outside a memory cell array region in which the memory elements are arranged.

15. The semiconductor memory device according to claim 1, wherein the first and second wirings cross each other.

16. The semiconductor memory device according to claim 2, wherein the first and second wirings cross each other.

17. The semiconductor memory device according to claim 1, wherein, to write data to a selected memory element of the memory elements, a current flows to a selected second wiring of the second wirings in a third direction, the current flowing in a fourth direction opposite to the third direction through the first transistors or diodes to two second wirings adjacent to the selected second wiring.

18. The semiconductor memory device according to claim 2, wherein, to write data to a selected memory element of the memory elements, a current flows to a selected first wiring of the first wirings in a fifth direction, the current flowing in a sixth direction opposite to the fifth direction through the second transistors or diodes to two first wirings adjacent to the selected first wiring.

* * * * *